(12) United States Patent
Sevenhans et al.

(10) Patent No.: US 6,357,044 B1
(45) Date of Patent: Mar. 12, 2002

(54) HYBRID FIBER-COAX TELECOMMUNICATION SYSTEM

(75) Inventors: Joannes Mathilda Josephus Sevenhans, Brasschaat; Christian Raymond Albert Botte, Melle; Christiaan Elise Willem Van Der Auwera, Mechelen, all of (BE)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/165,948

(22) Filed: Oct. 2, 1998

(30) Foreign Application Priority Data

Oct. 10, 1997 (EP) .............................. 97402382

(51) Int. Cl.$^7$ .............................................. H04N 7/173
(52) U.S. Cl. ......................................... 725/129; 725/98
(58) Field of Search ............................. 725/96, 98, 99, 725/105, 106, 116, 118, 129, 130

(56) References Cited

U.S. PATENT DOCUMENTS

| | | | |
|---|---|---|---|
| 4,979,035 A | | 12/1990 | Uehara et al. |
| 5,351,016 A | * | 9/1994 | Dent .......................... 332/103 |
| 5,471,497 A | * | 11/1995 | Zehavi ........................ 375/200 |
| 5,745,837 A | * | 4/1998 | Fuhrmann .................... 455/5.1 |
| 5,805,583 A | * | 9/1998 | Rakib ......................... 370/342 |
| 5,838,268 A | * | 11/1998 | Frenkel ........................ 341/11 |
| 5,970,092 A | * | 10/1999 | Currivan ..................... 375/232 |

FOREIGN PATENT DOCUMENTS

| | | |
|---|---|---|
| EP | 0762766 | 3/1997 |
| WO | 9641452 | 12/1996 |

OTHER PUBLICATIONS

"Power Splitter Combiners" RF/IF Designer's Handbook–Mini–Circuits, Edition 92/93 by Scientific Components pp. 2–2 to 2–19.

* cited by examiner

Primary Examiner—Andrew Faile
(74) Attorney, Agent, or Firm—Milton Oliver; Ware, Fressola, Van Der Sluys & Adolphson LLP

(57) ABSTRACT

A Hybrid Fiber-Coax [HFC] telecommunication system including several modulation devices (MC1–MCn) and a combiner device (CSN) coupled thereto. The modulation devices provide modulated telecommunication signals under the form of output currents that are applied to the combiner device that is further connected to a coaxial cable (COAX) for transmitting thereon these modulated signals in predetermined frequency channels according to the Frequency Division Multiple Access [FDMA] structure. The invention comprises in operating the combiner device as a current-mode summing node instead as of a voltage-mode summing node. As a result, the implementation is relatively easy, because a current summing node may be just a single junction point, and its linearity is thus obviously high. Furthermore, drivers or power amplifiers are generally not required between the modulation devices and the combiner device because there is no power dissipated in this combiner device, thus no power loss to be compensated. Additionally, the integration volume of the HFC telecommunication system is reduced, as well as the cost for an external combiner. The invention is also applicable to quadrature-phase modulation systems.

12 Claims, 2 Drawing Sheets

HYBRID FIBER-COAX TELECOMMUNICATION SYSTEM

BACKGROUND OF THE INVENTION

1. Technical Field

The present invention relates to a Hybrid Fiber-Coax [HFC] telecommunication system including a plurality of modulation means and a combiner means coupled thereto for receiving therefrom modulated signals, said combiner means being connected to a coaxial cable for transmitting thereon said modulated signals in predetermined frequency channels, different for each of said modulation means, each of said modulation means including signal mixer means having a first input connected to a quadrature signal generator adapted to supply a carrier signal thereto, a second input at which an analog telecommunication signal is applied, and an output coupled to said combiner means and at which the modulated signal is provided as a result of a modulation, in said signal mixer means, of said carrier signal by said analog telecommunication signal.

2. Discussion of Related Art

Such a Hybrid Fiber-Coax telecommunication system is generally known in the art. The idea of HFC is to put different telecommunication signals, received via optical fibers, onto distinct video channels and to apply these channels to the coaxial cable, preferably according to the Frequency Division Multiple Access [FDMA] structure. Each channel is modulated on a different carrier signal of which the frequency is in the video band. The outputs of the signal mixer means are generally connected to distinct inputs of the combiner means via drivers. The combiner means sums up the signals at the outputs of the drivers, i.e. sums up the voltages of the modulated signals.

A combiner means comprises at least one combiner as for instance known from Section 2: "Power Splitter/Combiners" of the "RF/IF Designer's Handbook—Mini-Circuits" edition 92/93 by Scientific Components. In general, a resistive or inductive combiner with an auto-transformer is used per two input signals, i.e. for two modulation means. Several of such combiners are then build in cascade so as to constitute a combiner means adapted to accept up to 12 voltage-mode input signals on a 50 or 75 Ohm interface. For each of these combiners, an auto-transformer introduces a 3 dB attenuation per two signals summed up, while a resistive combiner introduces a 6 dB attenuation.

This loss is a problem for the power of the above drivers. In fact, the driver is a power amplifier of which all the power is dissipated in the combiner connected thereto.

Another problem of the known HFC telecommunication system is the linearity requirement that is generally critical at the high frequencies wherein the system is used.

SUMMARY OF INVENTION

An object of the present invention is to provide a Hybrid Fiber-Coax telecommunication system of the known type but wherein the power consumption is reduced and the linearity is optimized.

According to the invention, this object is achieved due to the fact that said signal mixer means of each modulation means are adapted to provide, as modulated signal, an output current, and that said combiner means is a current summing node for the output currents of the signal mixer means of said plurality of modulation means.

The invention thus comprises in operating the combiner means as a current-mode summing node instead of as a voltage-mode summing node. The implementation of a current summing node is relatively easy and its linearity is higher than that of a voltage summing node. Furthermore, drivers or power amplifiers are no longer required because there is no power dissipated in such a combiner means, thus no power loss to be compensated. Additionally, the integration volume of the HFC telecommunication system is reduced, as well as the cost for an external combiner.

Another characteristic feature of the present invention is that said current summing node is a junction point coupled to the outputs of said signal mixer means and to said coaxial cable.

Summing of currents just needs to short the outputs of the current sources, i.e., in the present application, the signal mixer means. By reducing the combiner means to a single junction point, the linearity of the system is obviously optimized.

Also another characteristic feature of the present invention is that each of said signal mixer means includes a pair of mixer circuits to which quadrature carrier signals and quadrature analog telecommunication signals are applied via said first and second input respectively.

The present invention is thereby applicable to telecommunication systems of the quadrature-phase modulation type.

In a variant of the present invention, the outputs of the mixer circuits of each of said modulation means are coupled to the first mentioned current summing node via the cascade connection of a second current summing node and a current amplifier.

In some applications, current amplifiers may be necessary, for instance if the output currents of the mixer circuits are insufficient to be directly applied to the coaxial cable.

As the telecommunication signal provided to the modulation means is generally a digital signal, the present invention is also characterized in that said modulation means further includes digital-to-analog converter means connected to said second input of said signal mixer means and adapted to receive the telecommunication signal in a digital form and to convert it into an analog form prior to apply it to said signal mixer means.

BRIEF DESCRIPTION OF THE DRAWING

The above and other objects and features of the invention will become more apparent and the invention itself will be best understood by referring to the following description of an embodiment taken in conjunction with the accompanying drawings wherein.

DETAILED DESCRIPTION OF PREFERRED EMBODIMENTS

Figure 1:
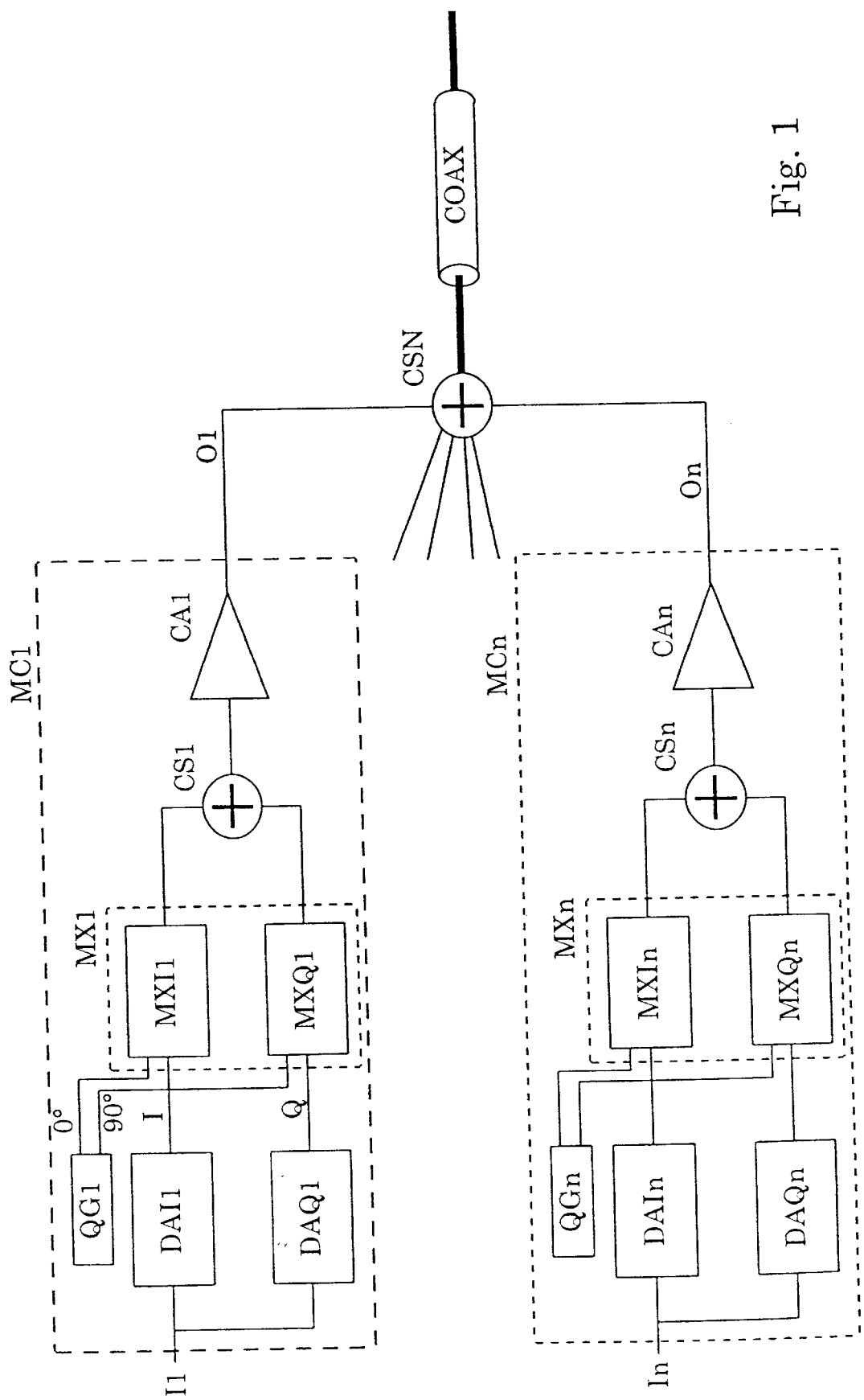
FIG. 1 shows a Hybrid Fiber-Coax [HFC] telecommunication system including several modulation devices (MC1–MCn) and a combiner device (CSN) according to the invention.

The Hybrid Fiber-Coax [HFC] telecommunication system shown in FIG. 1 is used to transmit telecommunication signals, received via different optical fibers, towards a single coaxial cable COAX onto which these signals are transmitted according to the known Frequency Division Multiple Access [FDMA] structure. To this end, the telecommunication system includes n, say n=12, modulation devices MC1–MCn adapted to receive the telecommunication signals in a digital form at an input I1-In thereof, and a current summing node CSN summing-up the output currents of the modulation devices and applying the result of this sum to the coaxial cable COAX.

Each of the modulation devices MC1/MCn includes two digital-to-analog converters DAI1/DAIn and DAQ1/DAQn having their input connected in common to the input I1/In of the modulation device and being able to convert the digital telecommunication signal received at this input into an analog telecommunication signal. The outputs of the digital-to-analog converters are signals I and Q in quadrature of phase. This means that the analog telecommunication signals at the outputs of the two converters have a relative phase difference of 90°. Each converter DAI1/DAIn, DAQ1/DAQn is connected to a first input of a distinct mixer circuit MXI1/MXIn, MXQ1/MXQn. A second input of these mixer circuits is connected to a quadrature signal generator QG1/QGn that provides a carrier signal of which the frequency is in or above the video-band, that ranges from 50 MHz to 800 MHz.

In more detail, the two mixer circuits MXI1/MXIn and MXQ1/MXQn of a modulation device MC1/MCn form together a mixer device MX1/MXn to which the digital-to-analog converters DAI1/DAIn and DAQ1/DAQn as well as the quadrature signal generator QG1/QGn are connected. An "in-phase" carrier signal 0° is provided by the quadrature signal generator and is applied to a first mixer circuit MXI1/MXIn of the mixer device MX1/MXn, while an "in-quadrature" (of phase) carrier signal 90°, also provided by the quadrature signal generator, is applied to the second mixer circuit MXQ1/MXQn of the mixer device. The mixer circuits are adapted to modulate the incoming carrier signal with the incoming analog telecommunication signal and to provide an output current as resulting modulated signal. The output currents of the two mixer circuits MXI1/MXIn and MXQ1/MXQn are applied to inputs of a current summing node CS1/CSn forming part of the modulation device MC1/MCn. The output of this current summing node CS1/CSn is connected to an input of a current amplifier CA1/CAn that also forms part of the modulation device MC1/MCn.

It is to be noted that the current summing node CS1/CSn is in fact only a junction point between the outputs of the mixer circuits and the current amplifier.

The structure of the present HFC telecommunication system is such that each modulation device MC1/MCn and more particularly the quadrature signal generator QG1/QGn thereof operates at a different frequency and at a different time moment so that, at outputs O1/On of the modulation devices MC1/MCn, the like-named telecommunication signals are modulated on different video frequency channels. As already mentioned, these modulated signals O1/On are provided under the form of currents. The frequency channels are then applied to another current summing node CSN where there are summed-up and the result of this sum is applied to the coaxial cable COAX. Here again, to sum-up the output currents from the different modulations devices MC1–MCn, the current summing node CSN may only consist in a junction point of the corresponding outputs O1–On with the coaxial cable COAX.

Figure 2:
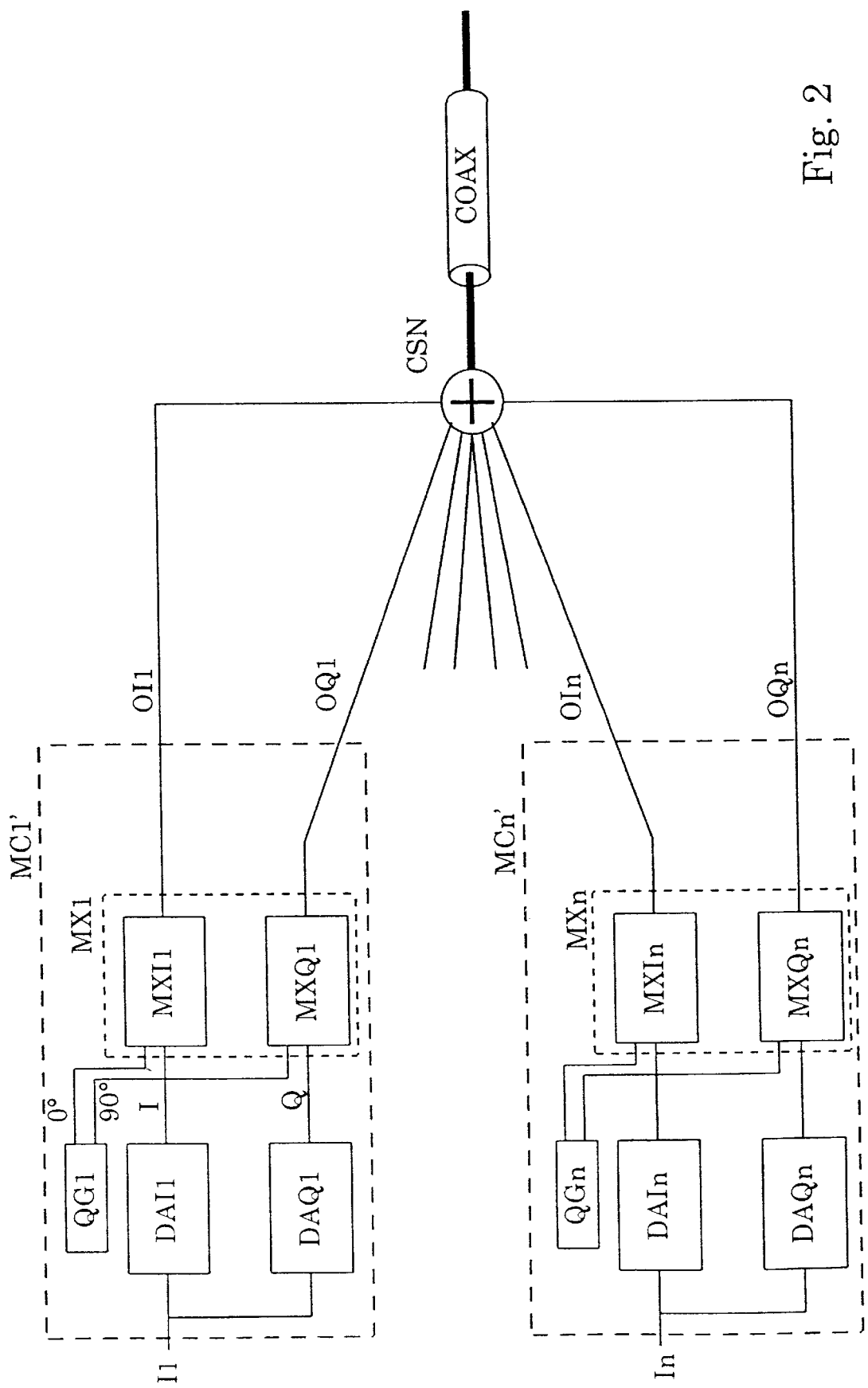
FIG. 2 shows a variant of the telecommunication system of FIG. 1.

When the currents at the outputs of the modulation devices MC1–MCn, and more particularly at the outputs of the mixer circuits MXI1, MXIn and MXQ1, MXQn thereof, is sufficiently high, the HFC telecommunication system may be simplified into a variant as shown in FIG. 2. Therein, the above current summing nodes CS1–CSn and the current amplifiers CA1–CAn are removed from the modulation devices MC1'–MCn'. As a result, the modulated signals or currents OI1, OIn/OQ1, OQn at the like-named outputs of the first MXI1/MXIn and the second MXQl/MXQn mixer circuit of the mixer devices MX1/MXn respectively, are directly applied to the current summing node, i.e. to the junction point CSN. In this variant of embodiment, the number of used components is obviously reduced.

While the principles of the invention have been described above in connection with specific apparatus, e.g. quadrature phase modulation, it is to be clearly understood that this description is made only by way of example and not as a limitation on the scope of the invention that is defined in the appended claims.

What is claimed is:

1. Hybrid Fiber-Coax telecommunication system including a plurality of modulation means (MC1–MCn) adapted to receive a telecommunications input signal (I1, In) from at least one optical fiber and a combiner means (CSN) coupled to said modulation means for receiving therefrom modulated signals (O1–On), said combiner means being connected to a coaxial cable (COAX) for transmitting thereon said modulated signals in predetermined frequency channels, different for each of said modulation means, each of said modulation means (MC1/MCn) including signal mixer means (MX1/MXn) having a first input connected to a quadrature signal generator (QG1/QGn) adapted to supply a carrier signal (0°, 90°) thereto, a second input at which an analog telecommunication signal (I, Q) is applied, and an output coupled to said combiner means and at which the modulated signal is provided as a result of a modulation, in said signal mixer means, of said carrier signal by said analog telecommunication signal, characterized in that said signal mixer means (MX1/MXn) of each modulation means (MC1/MCn) are adapted to provide, as a modulated signal (O1/On), a respective output current, and in that said combiner means (CSN) is a current summing node for the output currents of the signal mixer means of said plurality of modulation means.

2. Hybrid Fiber-Coax telecommunication system according to claim 1, characterized in that said current summing node (CSN) is a junction point coupled to the outputs of said signal mixer means (MX1/MXn) and to said coaxial cable (COAX).

3. Hybrid Fiber-Coax telecommunication system according to claim 1, characterized in that each of said signal mixer means (MX1/MXn) includes a pair of mixer circuits (MxI1, MXQ1/MXIn, MXQn) to which quadrature carrier signals (0°, 90°) and quadrature analog telecommunication signals (I, Q) are applied via said first and second input respectively.

4. Hybrid Fiber-Coax telecommunication system according to claim 3, characterized in that the outputs of the mixer circuits (MXI1, MXQ1/MXIn, MXQn) of each of said modulation means (MC1/MCn) are coupled to the first mentioned current summing node (CSN) via the cascade connection of a second current summing node (CS1/CSn) and a current amplifier (CA1/CAn).

5. Hybrid Fiber-Coax telecommunication system according to claim 4, characterized in that, for each of said modulation means (MC1/MCn), said second current summing node (CS1/CSn) is a junction point between the outputs of said mixer circuits (MAXI1, MXQ1/MXIn, MXQn) and an input of said current amplifier (CA1/CAn).

6. Hybrid Fiber-Coax telecommunication system according to claim 4, characterized in that said second current summing node (CS1/CSn) and said current amplifier (CA1/CAn) are included in said modulation means (MC1/MCn).

7. Hybrid Fiber-Coax telecommunication system according to claim 1, characterized in that said modulation means (MC1/MCn) further includes digital-to-analog converter means (DAI1, DAQ1/DAIn, DAQn) connected to said second input of said signal mixer means (MX1/MXn) and adapted to receive the telecommunication signal in a digital form and to convert it into an analog form (I, Q) prior to apply it to said signal mixer means.

8. Hybrid Fiber-Coax telecommunication system according to claim 3, characterized in that said digital-to-analog converter means (DAI1, DAQ1/DAIn, DAQn) includes a pair of digital-to-analog converters adapted to provide said quadrature analog telecommunication signal (I, Q).

9. Hybrid Fiber-Coax telecommunication system according to claim 1, characterized in that the frequency of the carrier signal (0°, 90°) supplied by said quadrature signal generator (QG1/QGn) is different for each modulation means (MC1/MCn) of said plurality.

10. Hybrid Fiber-Coax telecommunication system according to claim 1, characterized in that said plurality is constituted by 12 (n) modulation means (MC1–MCn) coupled to said combiner means (CSN).

11. Hybrid Fiber-Coax telecommunication system according to claim 1, characterized in that said system operates according to the Frequency Division Multiple Access [FDMA] structure.

12. Hybrid Fiber-Coax telecommunication system according to claim 7, characterized in that said digital-to-analog converter means (DAI1, DAQ1/DAIn, DAQn) includes a pair of digital-to-analog converters adapted to provide said quadrature analog telecommunication signal (I, Q).

* * * * *

UNITED STATES PATENT AND TRADEMARK OFFICE
CERTIFICATE OF CORRECTION

PATENT NO.   : 6,357,044 B1
DATED        : March 12, 2002
INVENTOR(S)  : Joannes Sevenhans et al.

It is certified that error appears in the above-identified patent and that said Letters Patent is hereby corrected as shown below:

Column 4,
Line 62, delete "MAXI1" and substitute -- MXI1 -- therefor.

Signed and Sealed this

Fourteenth Day of October, 2003

JAMES E. ROGAN
*Director of the United States Patent and Trademark Office*